United States Patent [19]

Ishimura et al.

[11] Patent Number: 5,602,672
[45] Date of Patent: Feb. 11, 1997

[54] LIGHT MODULATOR MODULE AND METHOD FOR FABRICATING LIGHT MODULATOR MODULE

[75] Inventors: Eitaro Ishimura; Yasunori Miyazaki; Minoru Kawano, all of Tokyo, Japan

[73] Assignee: Mitsubishi Denki Kabushiki Kaisha, Tokyo, Japan

[21] Appl. No.: 615,162

[22] Filed: Mar. 12, 1996

[30] Foreign Application Priority Data

Sep. 20, 1995 [JP] Japan ................................. 7-242014

[51] Int. Cl.[6] .......................... G02F 1/03; H04B 10/04; G02B 6/12
[52] U.S. Cl. ........................... 359/245; 359/180; 385/14
[58] Field of Search ................................ 359/180, 188, 359/245, 248; 385/14, 2

[56] References Cited

U.S. PATENT DOCUMENTS

| | | | |
|---|---|---|---|
| 5,317,581 | 5/1994 | Onishi et al. ............................. | 372/38 |
| 5,325,225 | 6/1994 | Suzaki et al. ............................ | 359/187 |
| 5,367,530 | 11/1994 | Noishiki et al. .......................... | 372/43 |
| 5,394,260 | 2/1995 | Suzuki et al. ............................ | 359/158 |
| 5,546,218 | 8/1996 | Komatsubara et al. ................ | 359/237 |

FOREIGN PATENT DOCUMENTS

| | | |
|---|---|---|
| 0472221 | 2/1992 | European Pat. Off. . |
| 62-3534 | 1/1987 | Japan . |
| 5327111 | 12/1993 | Japan . |
| 2292011 | 2/1996 | United Kingdom . |

*Primary Examiner*—Mark Hellner
*Attorney, Agent, or Firm*—Leydig, Voit & Mayer

[57] ABSTRACT

A light modulator module includes a submount; a semiconductor laser and a semiconductor light modulator having a signal input terminal integrated on the submount, the semiconductor laser outputting laser light and the semiconductor light modulator modulating the laser light in response to a high-frequency signal input to the signal input terminal; a strip line for transmitting the high-frequency signal, the strip line having first and second terminals, the second terminal receiving the high-frequency signal; a terminating resistor terminating the strip line and having opposed first and second ends with the second end being grounded; a first wire connecting the signal input terminal of the semiconductor light modulator to the first terminal of the strip line; and a second wire connecting the first end of the terminating resistor to the signal input terminal of the semiconductor light modulator. In this structure, the inductances of the first and second wires are present between the signal supply and the terminating resistor. When the frequency of the signal is increased, current flowing in the terminating resistor decreases, compensating for an increase in current flowing through the light modulator, whereby the frequency dependence of the total current is reduced. Deviation of impedance from a prescribed value and return loss are reduced.

20 Claims, 8 Drawing Sheets

5,602,672

LIGHT MODULATOR MODULE AND METHOD FOR FABRICATING LIGHT MODULATOR MODULE

FIELD OF THE INVENTION

The present invention relates to a light modulator module and a method of fabricating the light modulator module and, more particularly, to wiring to a semiconductor light modulator in the light modulator module.

BACKGROUND OF THE INVENTION

FIG. 10 (a) is a plan view schematically illustrating a prior art light modulator module for explaining wiring to a semiconductor light modulator. In the figure, reference numeral 25 designates an integrated light modulator and laser chip comprising a semiconductor laser 2 and a semiconductor light modulator 1 that is optically coupled with the laser 2. Although it is not shown in the figure, the semiconductor light modulator 1 is optically coupled with a lens. The integrated light modulator and laser chip 25 is disposed on a submount 9. A bonding pad 21 for the light modulator 1 and a bonding pad 22 for the laser 2 are disposed on a side of the submount 9. The submount 9 is disposed on a carrier 20 comprising a conductor.

On the carrier 20, an alumina dielectric strip 23 having a prescribed thickness is disposed parallel to with the submount 9, and a strip conductor 24 having a prescribed width is disposed in the center of the surface of the alumina dielectric 23. The carrier 20, the alumina dielectric 23, and the strip conductor 24 form a strip line 3 that is a kind of plane-parallel transmission line. For example, the strip line 3 comprising a 250 µm wide strip conductor 24 and a 250 µm thick alumina dielectric 23 and has a characteristic impedance $Z_0$ of 50 Ω. A terminating resistor 5 comprising a thin film resistor is fabricated on a terminal portion of the alumina dielectric 23. An end of the terminating resistor 5 is connected to a first terminal of the strip conductor 24 while the other end thereof is connected to a grounded throughhole 6. The resistance of the terminating resistor 5 is 50 Ω, that is, equivalent to the characteristic impedance $Z_0$ of the strip line 3 to make the strip line 3 a matching line. A second terminal, opposite the first terminal, of the strip conductor 24 is connected to a signal supply 8. A signal input terminal of the semiconductor light modulator 1 is connected to the first terminal of the strip conductor 24 via the bonding pad 21 with a wire 4. Preferably, a gold wire of diameter 25 µm is used as the wire 4. A feeding wire 7 for supplying an electrical current to the semiconductor laser 2 is connected to the semiconductor laser 2 via the bonding pad 22.

FIG. 10(b) is an equivalent circuit diagram of the light modulator module shown in FIG. 10(a), through which a high-frequency electrical signal input to the circuit from the signal supply 8 is transmitted to the semiconductor light modulator 1. In this equivalent circuit diagram, reference character $L_1$ denotes an inductance of the wire 4, C denotes a capacitance of the semiconductor light modulator 1, R denotes a resistance of the terminating resistor 5, and $Z_0$ denotes a characteristic impedance of the strip line 3. The strip line 3 having the characteristic impedance $Z_0$ is connected to the signal supply 8. The resistor R and a series circuit, comprising the inductance $L_1$ and the capacitance C, are connected in parallel, and a node of the resistor R and the series circuit is connected to the strip line 3. The inductance $L_1$ of the wire 4 is proportional to the length of the wire 4.

A description is given of the operation of the prior art light modulator module. Laser light emitted from the semiconductor laser 2 is input to the semiconductor light modulator 1. Since high-frequency electrical signals are applied through the strip line 3 and the wire 4 to the signal input terminal of the semiconductor light modulator 1, the laser light is modulated in response to the high-frequency signals and emitted to a lens. The high-frequency signals have a frequency band of 2~10 GHz.

When the semiconductor light modulator 1 modulates laser light with high-frequency electrical signals, if the impedance of the circuit viewed from the signal supply 8 is not equivalent to the impedance of the signal supply 8 viewed from the circuit, some of the high-frequency signals input to the circuit from the signal supply 8 do not reach the light modulator 1 and return to the signal supply 8. This phenomenon is called a high-frequency reflection or a return loss S11 and the return loss S11 is defined as S11=10 log (reflection power/input power)

As can be seen from FIG. 10(b), this return loss S11 is significantly influenced by the wiring to the semiconductor light modulator 1 because the impedance of the circuit viewed from the signal supply 8 depends on the inductance $L_1$ of the wire 4. When the return loss S11 is large, the waveform of the high-frequency electrical signal is distorted. So, the return loss S11 is desired to be as small as possible.

However, in the prior art light modulator module, for example, the return loss S11 at 2.5 GHz is as high as −5 dB, and it is necessary to reduce the return loss to about −10 dB.

SUMMARY OF THE INVENTION

It is an object of the present invention to provide a light modulator module that can reduce return loss by connecting a terminating resistor to a terminal of a strip line with a wire, and a method of fabricating the light modulator module.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a light modulator module comprises a signal supply for supplying a high-frequency electric signal; a semiconductor laser and a semiconductor light modulator having a signal input terminal being integrated on a submount, the semiconductor laser outputting a laser light and the semiconductor light modulator modulating the laser light in response to the high-frequency electric signal that is input to the signal input terminal; a strip line for transmitting the high-frequency electric signal, the strip line having opposed first and second terminals, the second terminal being connected to the signal supply; a terminating resistor for terminating the strip line, the terminating resistor having opposed first and second ends, the second end being grounded; a first wire connecting the signal input terminal of the semiconductor light modulator to the first terminal of the strip line; and a second wire connecting the first end of the terminating resistor to the signal input terminal of the semiconductor light modulator. In this structure, an inductance of the second wire and an inductance of the first wire are present between the signal supply and the terminating resistor. Therefore, when the frequency of the signal is increased, current flowing in the terminating resistor decreases, and this decrease compensates for an increase in current flowing through the light modulator, whereby the frequency dependence of the total current is reduced. As a result, a deviation of impedance of the circuit viewed from the signal supply from a prescribed value is reduced, and the return loss is reduced.

According to a second aspect of the present invention, in the above-described light modulator module, the terminating resistor is disposed on a portion of the submount. In this structure, since a vacant space of the submount is effectively utilized, the size of the light modulator module is reduced.

According to a third aspect of the present invention, in the above-described light modulator module, the location of the terminating resistor is changeable. Therefore, the length of the second wire can be changed so that the inductance of the second wire takes the optimum value by changing the location of the terminating resistor, whereby the return loss is minimized.

According to a fourth aspect of the present invention, the above-described light modulator module further includes a bonding pad disposed on the submount and relaying the second wire. Therefore, the second wire is divided into two parts, i.e., a part connecting the light modulator to the second bonding pad and a part connecting the second bonding pad to the terminating resistor. Since the length of each part of the second wire is short, the strength of the second wire is increased.

According to a fifth aspect of the present invention, a light modulator module comprises a signal supply for supplying a high-frequency electric signal; an integrated semiconductor laser and semiconductor light modulator, the semiconductor light modulator having a signal input terminal, the semiconductor laser outputting a laser light and the semiconductor light modulator modulating the laser light in response to the high-frequency electric signal that is input to the signal input terminal; a strip line for transmitting the high-frequency electric signal, the strip line having opposed first and second terminals, the second terminal being connected to the signal supply; a terminating resistor for terminating the strip line, the terminating resistor having opposed first and second ends, the second end being grounded; a first wire connecting the signal input terminal of the semiconductor light modulator to the first terminal of the strip line; and a second wire connecting the first end of the terminating resistor to an intermediate portion of the first wire. In this structure, an inductance of the second wire and an inductance of a portion of the first wire are present between the signal supply and the terminating resistor. Therefore, when the frequency of the signal is increased, current flowing in the terminating resistor decreases, and this decrease compensates for an increase in current flowing through the light modulator, whereby the frequency dependence of the total current is reduced. As a result, a deviation of impedance of the circuit viewed from the signal supply from a prescribed value is reduced, and the return loss is reduced.

According to a sixth aspect of the present invention, in the above-described light modulator module, the terminating resistor is disposed in the proximity of the first terminal of the strip line. Therefore, a part of a space for disposing the strip line can be spared for the terminating resistor 5, resulting in a reduction in the size of the light modulator module.

According to a seventh aspect of the present invention, in the above-described light modulator module, the second wire has an inductance L (nH) and the semiconductor light modulator has a capacitance C (pF), and the inductance L is set according to the following formula:

$$L\ (nH)=C\ (pF) \times m\ (m=0.7\text{--}2.5\ nH/pF)$$

Therefore, the inductance of the second wire is set at an optimum value according to the capacitance C of the semiconductor light modulator.

According to an eighth aspect of the present invention, a light modulator module comprises a signal supply for supplying a high-frequency electric signal; an integrated semiconductor laser and semiconductor light modulator, the semiconductor light modulator having a signal input terminal, the semiconductor laser outputting a laser light and the semiconductor light modulator modulating the laser light in response to the high-frequency electric signal that is input to the signal input terminal; a strip line for transmitting the high-frequency electric signal, the strip line having opposed first and second terminals, the second terminal being connected to the signal supply; a terminating resistor for terminating the strip line, the terminating resistor having opposed first and second ends, the second end being grounded; a first wire connecting the signal input terminal of the semiconductor light modulator to the first terminal of the strip line; and a second wire connecting the first end of the terminating resistor to the first terminal of the strip line. In this structure, an inductance of the second wire and an inductance of the first wire are present between the signal supply and the terminating resistor. Therefore, when the frequency of the signal is increased, current flowing in the terminating resistor decreases, and this decrease compensates for an increase in current flowing through the light modulator, whereby the frequency dependence of the total current is reduced. As a result, a deviation of impedance of the circuit viewed from the signal supply from a prescribed value is reduced, and the return loss is reduced.

According to a ninth aspect of the present invention, a method of fabricating a light modulator module comprises preparing a submount on which a semiconductor laser and a semiconductor light modulator having a signal input terminal are mounted, the semiconductor laser outputting a laser light and the semiconductor light modulator modulating the laser light in response to a high-frequency electric signal that is input to the signal input terminal of the light modulator from a signal supply; disposing a submount on a carrier; disposing a strip line for transmitting the high-frequency electric signal on the carrier, the strip line having opposed first and second terminals, the second terminal being connected to the signal supply; disposing a terminating resistor for terminating the strip line on the carrier, the terminating resistor having opposed first and second ends, the second end being grounded; connecting the signal input terminal of the semiconductor light modulator to the first terminal of the strip line with a first wire; and connecting the first end of the terminating resistor to the signal input terminal of the semiconductor light modulator with a second wire. In a light modulator module fabricated as described above, an inductance of the second wire and an inductance of the first wire are present between the signal supply and the terminating resistor. Therefore, when the frequency of the signal is increased, current flowing in the terminating resistor decreases, and this decrease compensates for an increase in current flowing through the light modulator, whereby the frequency dependence of the total current is reduced. As a result, a deviation of impedance of the circuit viewed from the signal supply from a prescribed value is reduced, and the return loss is reduced.

According to a tenth aspect of the present invention, in the above-described method, the terminating resistor is disposed on a portion of the submount. Since a vacant space of the submount is effectively utilized, the size of the light modulator module is reduced.

According to an eleventh aspect of the present invention, in the above-described method, the length of the second wire is adjusted by changing the position where the terminating resistor is disposed. Therefore, the length of the second wire can be changed so that the inductance of the second wire takes the optimum value by changing the location of the terminating resistor, whereby the return loss is minimized.

According to a twelfth aspect of the present invention, in the above-described method, a bonding pad that relays the second wire is disposed on the submount. Therefore, the second wire is divided into two parts, i.e., a part connecting the light modulator to the second bonding pad and a part connecting the Second bonding pad to the terminating resistor. Since the length of each part of the second wire is short, the strength of the second wire is increased.

According to a thirteenth aspect of the present invention, a method of fabricating a light modulator module comprises preparing a submount on which a semiconductor laser and a semiconductor light modulator having a signal input terminal are mounted, the semiconductor laser outputting a laser light and the semiconductor light modulator modulating the laser light in response to a high-frequency electric signal that is input to the signal input terminal of the light modulator from a signal supply; disposing the submount on a carrier; disposing a strip line for transmitting the high-frequency electric signal on the carrier, the strip line having opposed first and second terminals, the second terminal being connected to the signal supply; disposing a terminating resistor for terminating the strip line on the carrier, the terminating resistor having opposed first and second ends, the second end being grounded; connecting the signal input terminal of the semiconductor light modulator to the first terminal of the strip line with a first wire; and connecting the first end of the terminating resistor to an intermediate portion of the first wire with a second wire. In a light modulator module fabricated as described above, an inductance of the second wire and an inductance of a portion of the first wire are present between the signal supply and the terminating resistor. Therefore, when the frequency of the signal is increased, current flowing in the terminating resistor decreases, and this decrease compensates for an increase in current flowing through the light modulator, whereby the frequency dependence of the total current is reduced. As a result, a deviation of impedance of the circuit viewed from the signal supply from a prescribed value is reduced, and the return loss is reduced.

According to a fourteenth aspect of the present invention, in the above-described method, the terminating resistor is disposed in the proximity of the first terminal of the strip line. Therefore, a part of a space for disposing the strip line can be spared for the terminating resistor 5, resulting in a reduction in the size of the light modulator module.

According to a fifteenth aspect of the present invention, in the above-described method, the second wire has an inductance L (nH) and the semiconductor light modulator has a capacitance C (pF), and the inductance L is set according to the following formula:

$L \ (nH) = C \ (pF) \times m \ (m=0.7\text{--}2.5 \ nH/pF)$

Therefore, the inductance of the second wire is set at an optimum value according to the capacitance C of the semiconductor light modulator.

According to a sixteenth aspect of the present invention, a method of fabricating a light modulator module comprises preparing a submount on which a semiconductor laser and a semiconductor light modulator having a signal input terminal are mounted, the semiconductor laser outputting a laser light and the semiconductor light modulator modulating the laser light in response to a high-frequency electric signal that is input to the signal input terminal of the light modulator from a signal supply; disposing the submount on a carrier; disposing a strip line for transmitting the high-frequency electric signal on the carrier, the strip line having opposed first and second terminals, the second terminal being connected to the signal supply; disposing a terminating resistor for terminating the strip line on the carrier, the terminating resistor having opposed first and second ends, the second end being grounded; connecting the signal input terminal of the semiconductor light modulator to the first terminal of the strip line with a first wire; and connecting the first end of the terminating resistor to the first terminal of the strip line with a second wire. In a light modulator module fabricated as described above, an inductance of the second wire and an inductance of the first wire are present between the signal supply and the terminating resistor. Therefore, when the frequency of the signal is increased, current flowing in the terminating resistor decreases, and this decrease compensates for an increase in current flowing through the light modulator, whereby the frequency dependence of the total current is reduced. As a result, a deviation of impedance of the circuit viewed from the signal supply from a prescribed value is reduced, and the return loss is reduced.

DETAILED DESCRIPTION OF THE PREFERRED EMBODIMENTS

[Embodiment 1]

Figure 1:
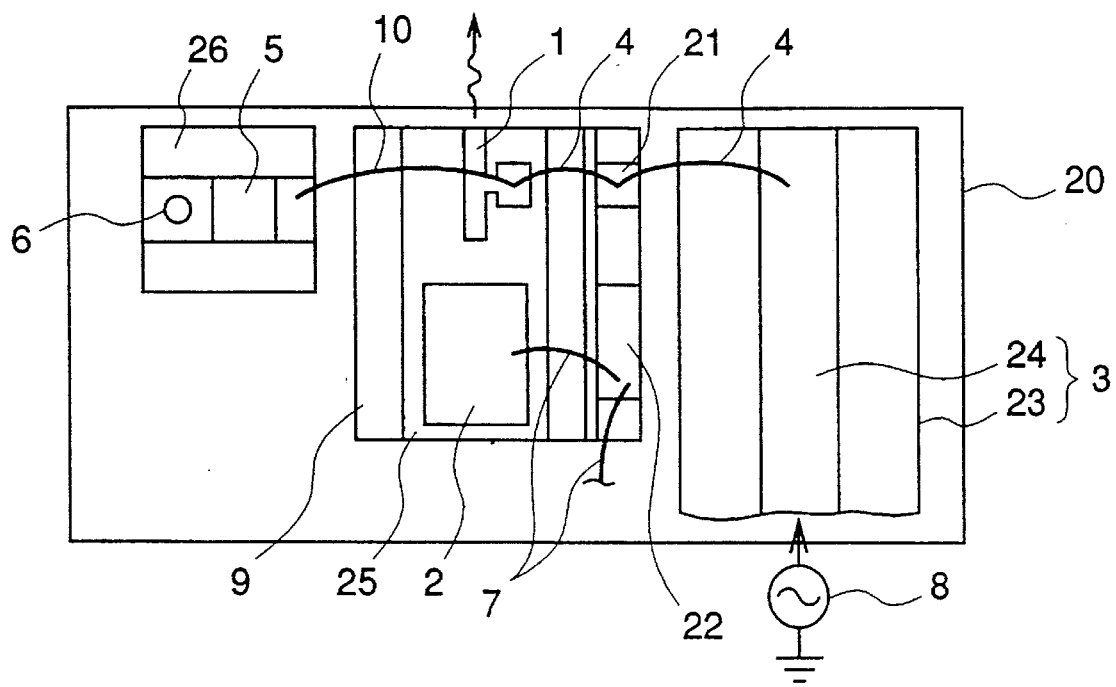
FIG. 1(a) is a plan view schematically illustrating a light modulator module in accordance with a first embodiment of the present invention.
FIG. 1(b) is an equivalent circuit diagram thereof.
Figure 1:
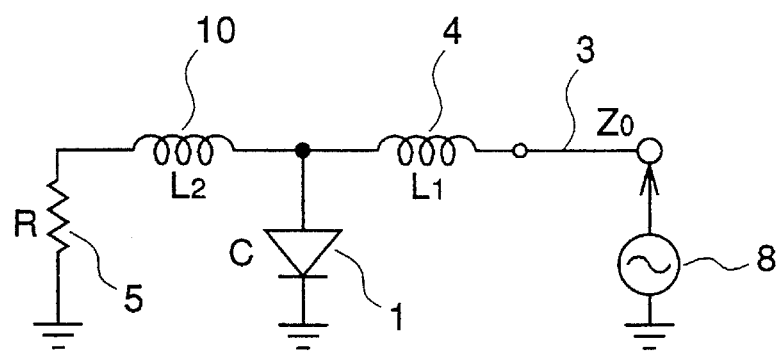

FIG. 1(a) is a plan view schematically illustrating a light modulator module for explaining wiring to a semiconductor light modulator in accordance with a first embodiment of the present invention. In the figure, reference numeral 25 designates an integrated light modulator and laser chip comprising a semiconductor laser 2 and a semiconductor light modulator 1 that is optically coupled with the laser 2. The light modulator 1 modulates a laser light output from the laser 2 in response to a high-frequency electrical signal supplied from a signal supply 8. Although it is not shown in the figure, the semiconductor light modulator 1 is optically coupled with a lens. The integrated light modulator and laser chip 25 is disposed on a submount 9. A bonding pad 21 for the light modulator 1 and a bonding pad 22 for the laser 2 are disposed on a side of the submount 9. The submount 9 is disposed on a carrier 20 comprising a conductor.

On the carrier 20, a strip line 3 and a terminating resistor 5 are disposed on both sides of and in parallel with the submount 9. More specifically, on the right side of the submount 9 in the figure, as alumina dielectric 23 having a prescribed thickness is disposed in parallel with the submount 9, and a strip conductor 24 having a prescribed width is disposed in the center of the surface of the alumina dielectric 23. The carrier 20, the alumina dielectric 23, and the strip conductor 24 form the strip line 3 that is a kind of plane-parallel transmission line. For example, the strip line 3 comprises a 250 μm wide strip conductor 24 and a 250 μm thick alumina dielectric 23 and has a characteristic impedance $Z_0$ of 50 Ω. A first terminal of the strip conductor 24 is connected to a signal input terminal of the semiconductor light modulator 1 with a first wire 4, and a second terminal, opposite the first terminal, of the strip conductor 24 is connected to the signal supply 8. The first wire 4 is relayed at the bonding pad 21. This bonding pad 21 facilitates wiring to the submount 9 when the submount 9 is mounted on the carrier 20. That is, in subassembly of the submount 9, the semiconductor light modulator 1 is connected to the bonding pad 21 with a wire and, when the submount 9 is mounted on the carrier 20, the bonding pad 21 is connected to the strip line 3 with a wire. Preferably, a gold wire of diameter 25 μm is used as the first wire 4.

On the left side of the submount 9 in the figure, an alumina substrate 26 is disposed, and a terminating resistor comprising a thin film resistor is disposed on the alumina substrate 26. An end of the terminating resistor 5 is connected to the signal input terminal of the light modulator 1 with a second wire 10, and the other end of the terminating resistor 5 is connected to a grounded through-hole 6. The resistance of the terminating resistor 5 is 50Ω, that is, equivalent to the characteristic impedance $Z_0$ of the strip line 3 to make the strip line 3 a matching line. A wire of the same material as the first wire 4 is used as the second wire 10. A feeding wire 7 for supplying an electrical current to the semiconductor laser 2 is connected to the semiconductor laser 2 via a bonding pad 22.

FIG. 1(b) is an equivalent circuit diagram of the light modulator module shown in FIG. 1(a), through which a high-frequency electrical signal input to the circuit from the signal supply 8 is transmitted to the semiconductor light modulator 1. In this equivalent circuit, reference character $L_1$ denotes an inductance of the first wire 4, $L_2$ denotes an inductance of the second wire 10, C denotes a capacitance of the semiconductor light modulator 1, R denotes a resistance of the terminating resistor 5, $Z_0$ denotes a characteristic impedance of the strip line 3. The strip line 3 having the characteristic impedance $Z_0$ is connected to the signal supply 8. The inductance $L_1$ is connected to the strip line 3. The capacitance C and a series circuit, comprising the inductance $L_2$ and the resistor R, are connected in parallel, and a node of the capacitance C and the series circuit is connected to the inductance $L_1$.

Figure 10:
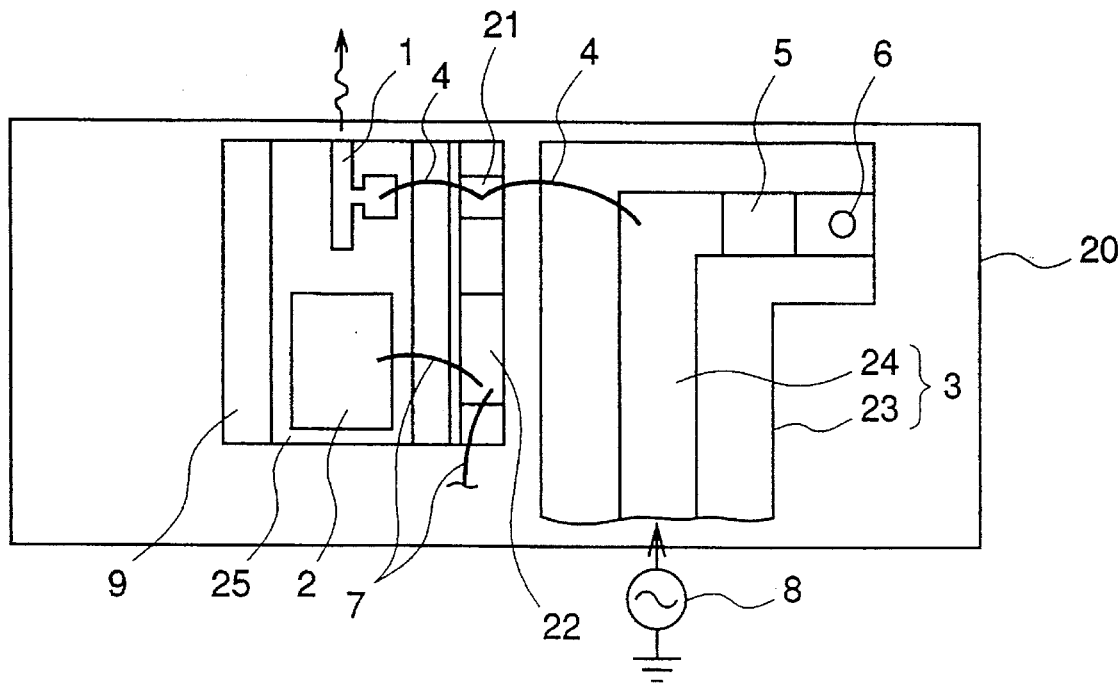
FIG. 10(a) is a plan view schematically illustrating a light modulator module in accordance with the prior art.
FIG. 10(b) is an equivalent circuit diagram thereof.
Figure 10:
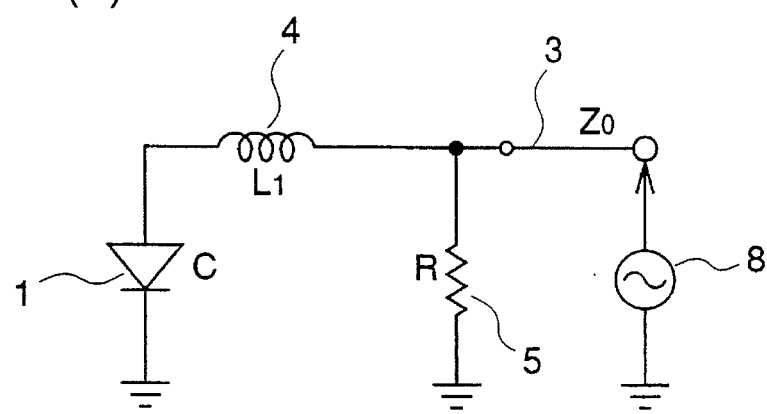

In the prior art structure, the terminating resistor 5 is connected directly to the strip line 3. In this first embodiment, however, the terminating resistor 5 is connected to the strip line 3 through the second wire 10 and the first wire 4, so that the return loss S11 of the high-frequency signal is reduced compared to that provided in the prior art structure. For example, in the equivalent circuit diagrams according to the prior art (FIG. 10(b)) and according to the first embodiment of the invention (FIG. 1(b)), when the return loss S11 is calculated on the assumption that the capacitance C of the light modulator 1 is 0.8 pF, the inductance $L_1$ of the first wire 4 is 0.5 nH, the inductance $L_2$ of the second wire 10 is 1.2 nH, and the resistance R of the terminating resistor 5 is 50 Ω, the results are plotted as shown in FIG. 2. FIG. 2 is a graph showing return loss S11 (dB) vs. frequency (GHz) characteristics according to the first embodiment in comparison with the prior art. As shown in FIG. 2, both in the first embodiment and the prior art, the return loss S11 increases with an increase in the frequency in the available frequency range from 2 GHz to 10 GHz. When the return loss S11 according to the first embodiment is compared to the return loss S11 according to the prior art at 2.5 GHz, the former is about 10 dB lower than the latter. That is, the return loss S11 according to the first embodiment is reduced to about 1/10 of the return loss S11 according to the prior art.

The function of the circuit according to this first embodiment will be described. The return loss S11 takes its smallest value when the impedance of the circuit connected to the signal supply 8 is equal to the characteristic impedance of the strip line 3, i.e., 50 Ω, viewed from the signal supply 8. However, in the prior art circuit, as can be seen from FIG. 3(a), the current IR flowing through the resistance R (50Ω) of the terminating resistor is constant even when the frequency is increased. On the other hand, in the series circuit comprising the inductance $L_1$ of the first wire and the capacitance C of the light modulator 1, when the frequency is increased, the reactance of the capacitance C decreases, exceeding an increase in the reactance of the inductance $L_1$ within the available frequency range from 2 GHz to 10 GHz, so that the current IC flowing through the capacitance C of the light modulator increases with the increase in the frequency. Therefore, the total impedance of the circuit viewed from the input terminal becomes lower than 50Ω, whereby the return loss S11 is increased.

Figure 3:
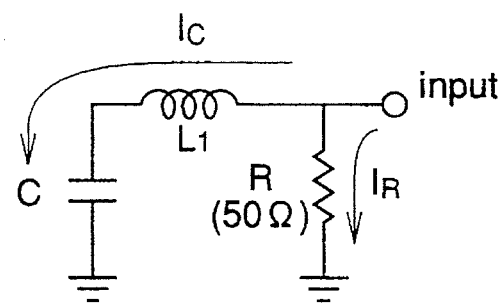
FIGS. 3(a) and 3(b) are circuit diagrams for explaining a function of the first embodiment of the present invention.
Figure 3:
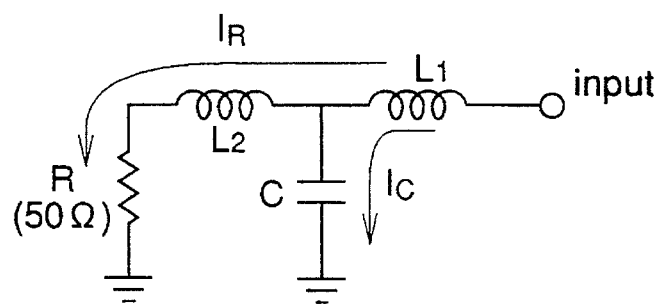

However, in the circuit according to the first embodiment of the invention, as can be seen from FIG. 3(b), since the inductance $L_1$ of the first wire 4 and the inductance $L_2$ of the second wire 10 are present between the resistance R of the terminating resistor 5 and the input terminal, when the frequency is increased, the current IR flowing through the resistance R of the terminating resistor 5 decreases. The decrease in the current IR compensates for the increase in the current IC flowing through the capacitance C of the light modulator 1. As a result, the frequency dependence of the total current, i.e., IR+IC, is reduced. In other words, the deviation of the impedance of the circuit viewed from the signal supply 8 from 50Ω is reduced and, in this first embodiment, the return loss S11 is reduced as compared to that obtained in the prior art circuit.

Figure 4:
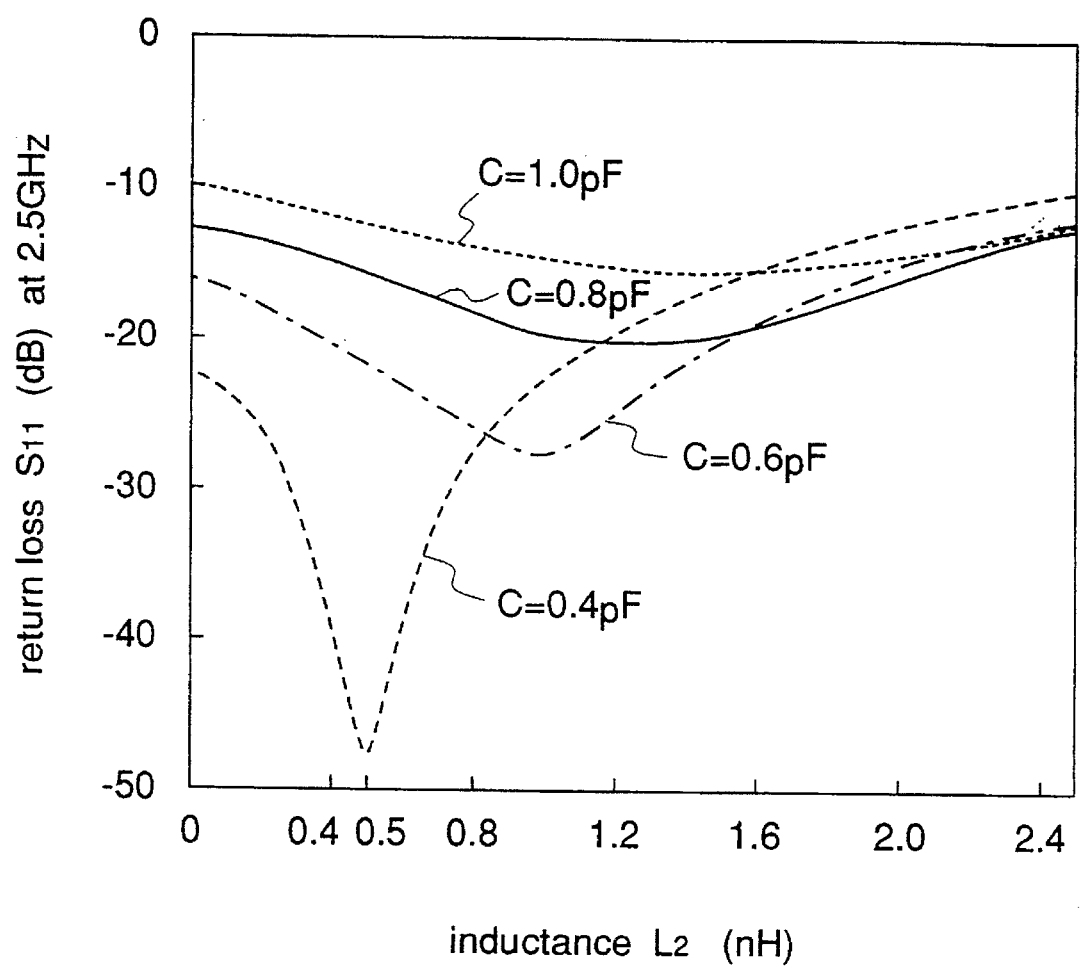
FIG. 4 is a graph showing the relationship between inductance of a second wire and return loss in accordance with the first embodiment of the present invention.

Next, an optimum value for the inductance $L_2$ of the second wire 10 will be examined. The inductance $L_1$ of the first wire 4 is about 0.5 nH, which is equivalent to 500 μm when it is converted into a length of an Au wire of diameter 25 μm. The capacitance C of the light modulator 1 is 0.4~0.8 pF. The return loss S11 is calculated at four different capacitances C, i.e., 0.4, 0.6, 0.8, and 1.0 pF, and the results are plotted as shown in FIG. 4. FIG. 4 is a graph illustrating the dependence of the return loss S11 on the inductance L2 at 2.5 GHz. As can be seen from the graph, the value of the inductance $L_2$ at which the return loss S11 takes its smallest value (hereinafter referred to as optimum inductance $L_2$) varies according to the value of the capacitance C, but the optimum inductance $L_2$ can be approximately represented by $$L_2(nH)=C(pF)\times m(nH/pF) \ldots (1)$$

wherein m is a proportionality constant (m=0.7~2.5).

For example, when the capacitance C is 0.4 pF, the optimum inductance $L_2$ is about 0.5 nH from FIG. 4 and the proportionality constant m in this case is 1.25 from the formula (1).

Figure 5:
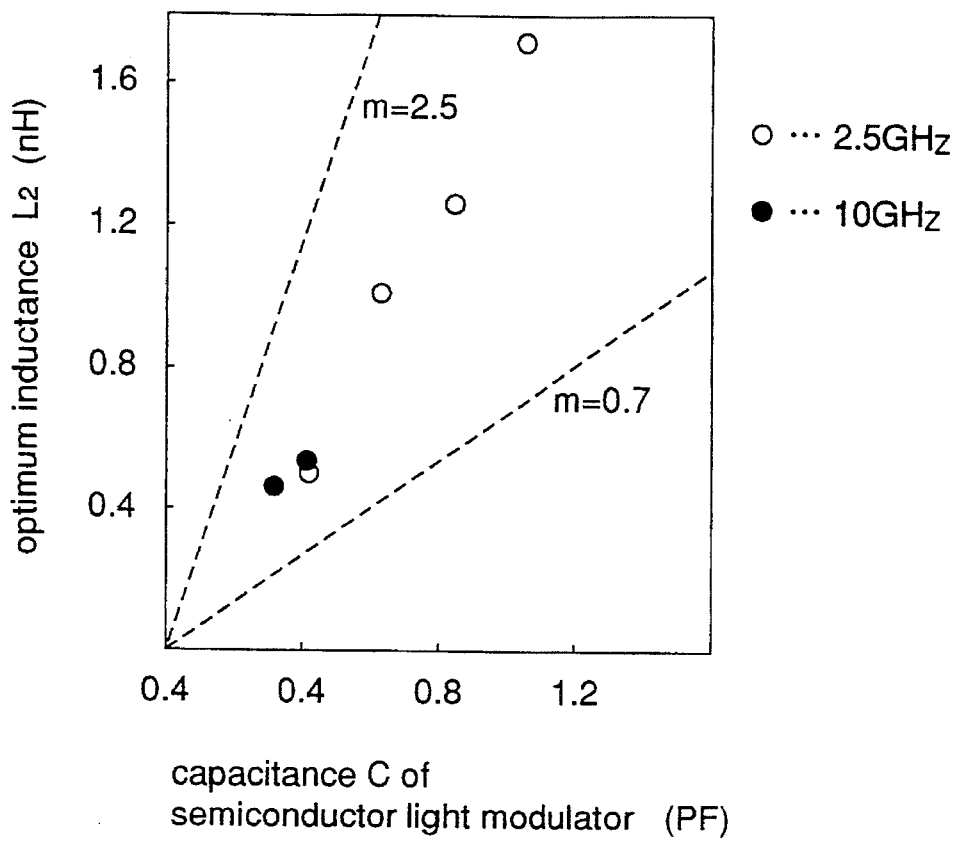
FIG. 5 is a graph showing the relationship between optimum inductance of the second wire and capacitance of a semiconductor light modulator in accordance with the first embodiment of the present invention.

The relationship between the capacitance C and the optimum inductance $L_2$ is shown in FIG. 5. In FIG. 5, marks ○ and ● represent values of the optimum inductance $L_2$ at 2.5 GHz and 10 GHz, respectively. Since all the plots take values within a range from m=0.7 to m=2.5 in FIG. 5, it is confirmed that the formula (1) is correct.

Although the results shown in FIGS. 4 and 5 are obtained when the inductance $L_1$ of the first wire 4 is 0.5nH, even when the inductance $L_1$ takes a value other than 0.5nH, it satisfies the condition of m=0.7~2.5 in the formula (1), so that the formula (1) is applicable to this case. In addition, the examination of the optimum inductance $L_2$ in this case is carried out in a similar manner as described above.

As described above, according to the first embodiment of the invention, since the terminating resistor 5 is connected to the signal input terminal of the semiconductor light modulator 1 through the second wire 10 and the first wire 4, the inductance $L_2$ of the second wire 10 and the inductance $L_1$ of the first wire 4 are present between the signal supply 8 and the terminating resistor 5. Therefore, when the frequency is increased, the current IR flowing through the terminating resistor 5 decreases, and this decrease in the current IR compensates for an increase in the current IC flowing through the light modulator 1 due to the increase in the frequency. As a result, the return loss S11 is reduced.

Furthermore, since the inductance $L_2$ of the second wire 10 is set on the basis of the formula (1), the inductance $L_2$ can be set at an optimum value for the capacitance C of the light modulator 1.

[Embodiment 2]

Figure 6:
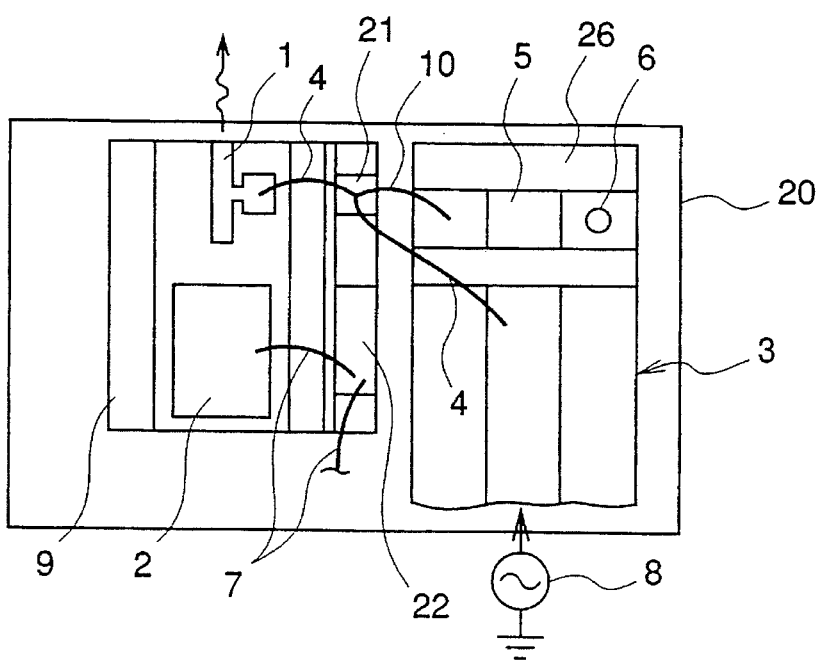
FIG. 6 is a plan view schematically illustrating a light modulator module in accordance with a second embodiment of the present invention.

FIG. 6 is a plan view schematically illustrating a light modulator module for explaining wiring to a semiconductor light modulator in accordance with a second embodiment of the present invention. In FIG. 6, the same reference numerals as those shown in FIG. 1'(a) designate the same or corresponding parts. The structure shown in FIG. 6 is fundamentally identical to the structure shown in FIG. 1'(a) except that the terminating resistor 5 is located in the proximity of the first terminal of the strip line 3 and connected to the bonding pad 21 with the second wire 10. More specifically, the alumina substrate 26 is disposed on an extension line of the strip line 3 and adjacent to the first terminal of the strip line 3, and the terminating resistor 5 is disposed on the alumina substrate 26 so that it extends in the width direction of the strip line 3. An end of the terminating resistor 5 is connected to a grounded through-hole 6 and the other end thereof is connected to the bonding pad 21 with the second wire 10. That is, the nongrounded end of the terminating resistor 5 is connected to the first terminal of the strip line 3 through the second wire 10 and a part of the first wire 4.

Figure 2:
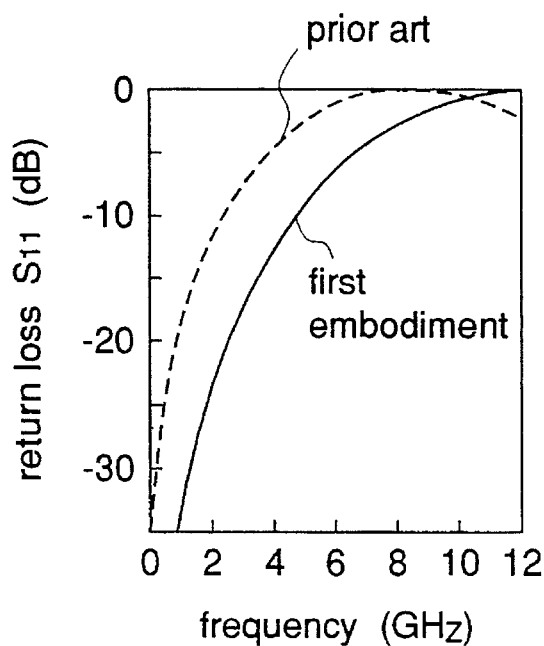
FIG. 2 is a graph showing the relationship between frequency and return loss for explaining an effect of the first embodiment of the present invention.

In this second embodiment of the invention, since the terminating resistor 5 is located in the proximity of the first terminal of the strip line 3, a part of the space for disposing the strip line 3 can be spared for the terminating resistor 5, whereby the space for the terminating resistor 5 on the left side of the submount 9 shown in FIG. 1'(a) is dispensed with, resulting in a reduction in the size of the light modulator module.

Furthermore, differently from the structure according to the first embodiment, the terminating resistor 5 is connected to an intermediate portion of the first wire 4 with the second wire 10. Also in this case, the inductance $L_2$ of the second wire 10 and the inductance $L_1$ of a part of the first wire 4 are present between the signal supply 8 and the terminating resistor 5. Therefore, when the frequency is increased, the current IR flowing through the terminating resistor 5 decreases, and this decrease in the current IR compensates for an increase in the current IC flowing through the light modulator 1 due to the increase in the frequency. As a result, the return loss S11 is reduced.

[Embodiment 3]

Figure 7:
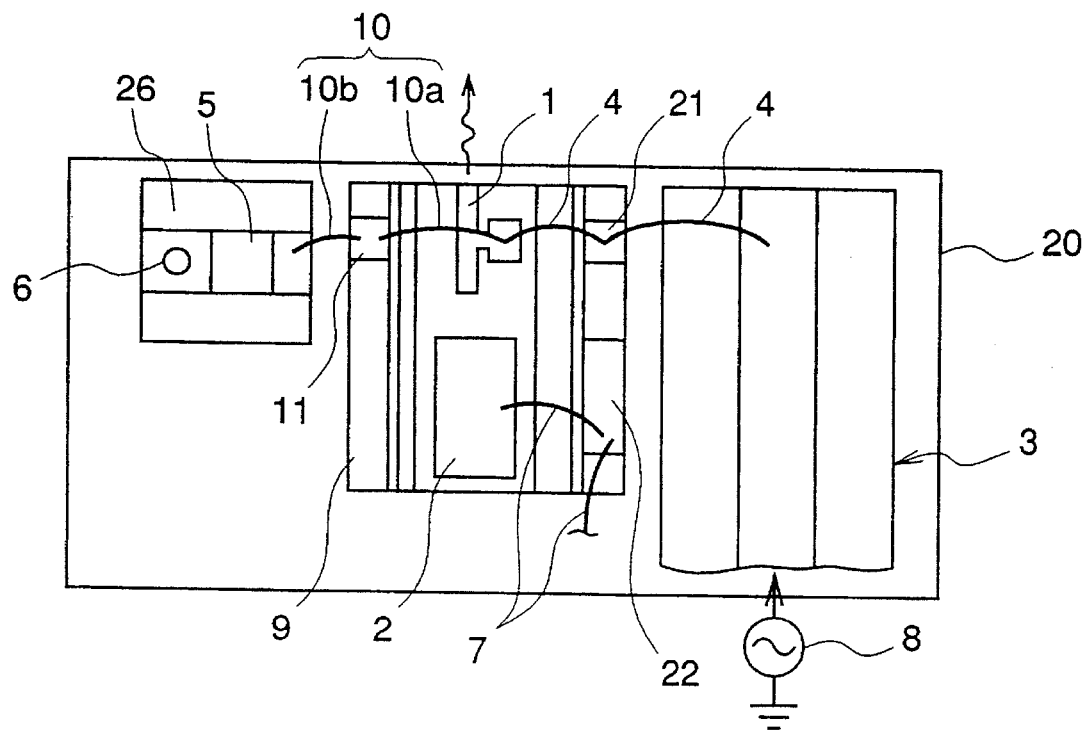
FIG. 7 is a plan view schematically illustrating a light modulator module in accordance with a third embodiment of the present invention.

FIG. 7 is a plan view schematically illustrating a light modulator module for explaining wiring to a semiconductor light modulator in accordance with a third embodiment of the present invention. In the figure, the same reference numerals as those in FIG. 1'(a) designate the same or corresponding parts. The structure shown in FIG. 7 is fundamentally identical to the structure shown in FIG. 1'(a) except that a second bonding pad 11 is disposed on a portion of the submount 9 between the terminating resistor 5 and the semiconductor light modulator 1, and the second wire 10 connecting the terminating resistor 5 to the light modulator 1 is relayed at the second bonding pad 11.

In this third embodiment of the invention, the second bonding pad 11 that relays the second wire 10 is disposed on the submount 9, and the second wire 10 is divided into two parts, i.e., a part 10a connecting the light modulator 1 to the second bonding pad 11 and a part 10b connecting the second bonding pad 11 to the terminating resistor 5. Since the length of each part of the wire 10 is short, the strength of the wire 10 is increased.

[Embodiment 4]

Figure 8:
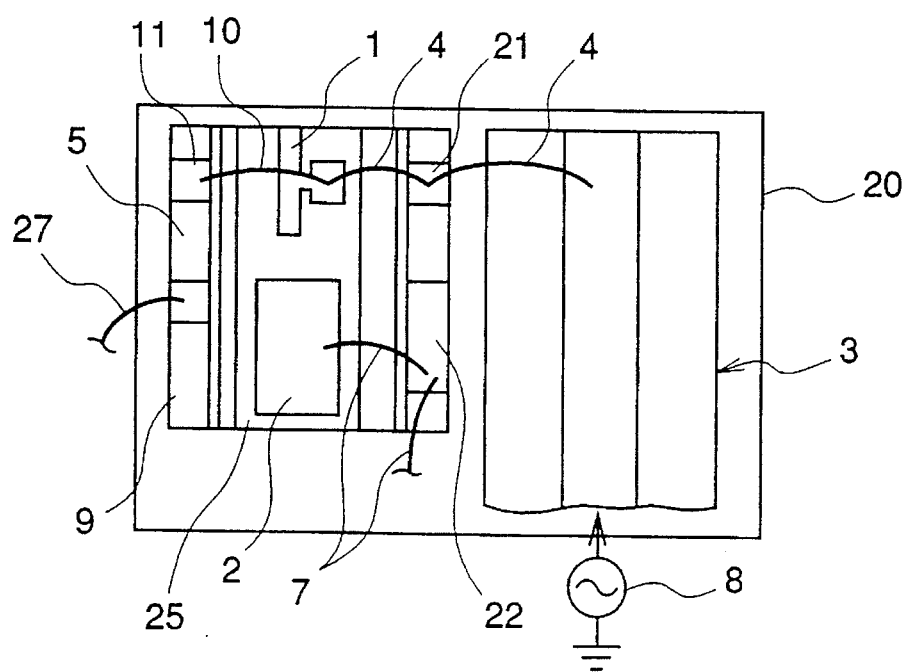
FIG. 8 is a plan view schematically illustrating a light modulator module in accordance with a fourth embodiment of the present invention.

FIG. 8 is a plan view schematically illustrating a light modulator module for explaining a wiring to a semiconductor light modulator in accordance with a fourth embodiment of the present invention. In the figure, the same reference numerals as those in FIG. 1'(a) designate the same or corresponding parts. The structure shown in FIG. 8 is fundamentally identical to the structure shown in FIG. 1'(a) except that the terminating resistor 5 is disposed on the submount 9. More specifically, the terminating resistor 5 is located on a vacant space of the submount 9 on the left side of the integrated light modulator and laser 25. An end of the terminating resistor 5 is directly connected to the second bonding pad 11 that is connected to the light modulator 1 with the second wire 10, and the other end thereof is connected to the ground with a third wire 27.

In this fourth embodiment of the present invention, since the terminating resistor 5 is disposed on the submount 9, vacant space of the submount 9 can be effectively utilized, resulting in a reduction in the size of the light modulator module.

11

[Embodiment 5]

Figure 9:
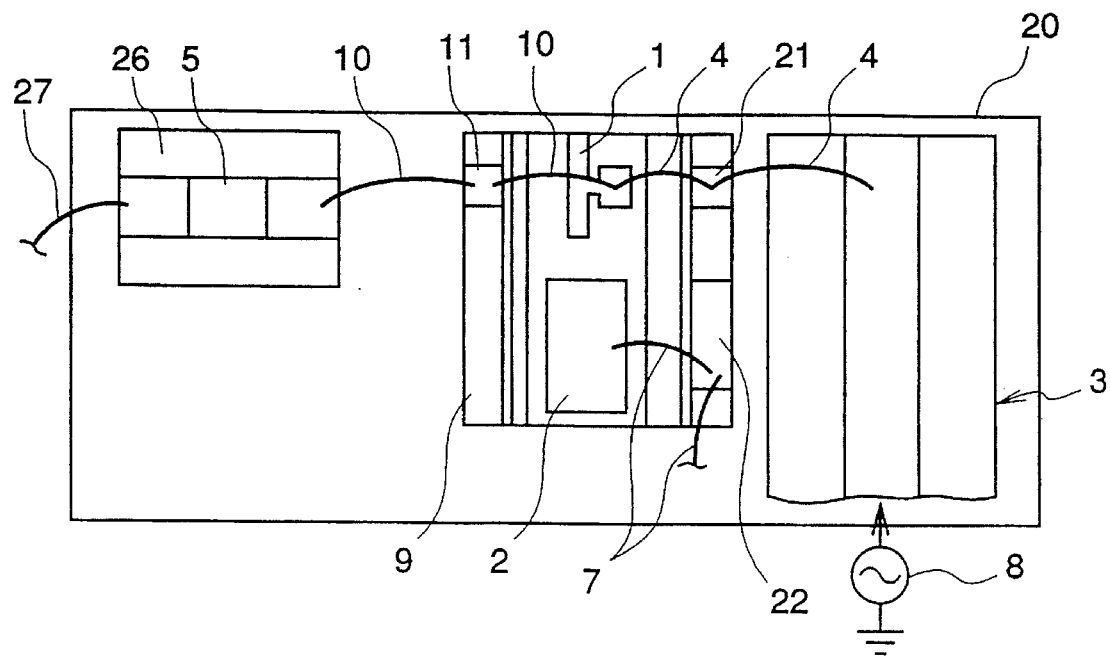
FIG. 9 is a plan view schematically illustrating a light modulator module in accordance with a fifth embodiment of the present invention.

FIG. 9 is a plan view schematically illustrating a light modulator module for explaining a wiring to a semiconductor light modulator in accordance with a fifth embodiment of the present invention. In the figure, the same reference numerals as those shown in FIG. 1'(a) designate the same or corresponding parts. The structure shown in FIG. 9 is fundamentally identical to the structure shown in FIG. 1'(a) except that the location of the terminating resistor 5 is changeable. More specifically, the terminating resistor 5, for example, a resistor chip, is fixed to the alumina substrate 26. In fabrication of the light modulator module, the alumina substrate 26 is fixed to a prescribed portion of the carrier 20 with solder or the like. An end of the terminating resistor 5 is connected to the light modulator 1 with the second wire 10 via the second bonding pad 11, and the other end is connected to the ground with the third wire 27. Since the terminating resistor 5 is grounded not by a through-hole as shown in FIG. 7 but by the third wire 27, the alumina substrate 26 is movable before it is fixed to the carrier 20.

Since the alumina substrate 26 is movable as described above, even when the light modulator module is judged to be defective in the inspection process because of a large return loss, it is possible to make the light modulator module nondefective by changing the location of the alumina substrate 26 and adjusting the length of the second wire 10 so that the return loss S11 takes its smallest value. Likewise, when the light modulator module is fabricated, the capacitance C of the light modulator 1 is measured and ranked and, thereafter, the terminating resistor 5 is located so that the second wire 10 has an optimum length for the capacitance C of the rank, whereby the return loss S11 of the light modulator module is reduced in mass production.

As described above, in this fifth embodiment of the invention, since the location of the terminating resistor 5 is changeable, the smallest return loss S11 is realized by adjusting the length of the second wire 10 so that the wire has the optimum inductance.

[Embodiment 6]

Figure 11:
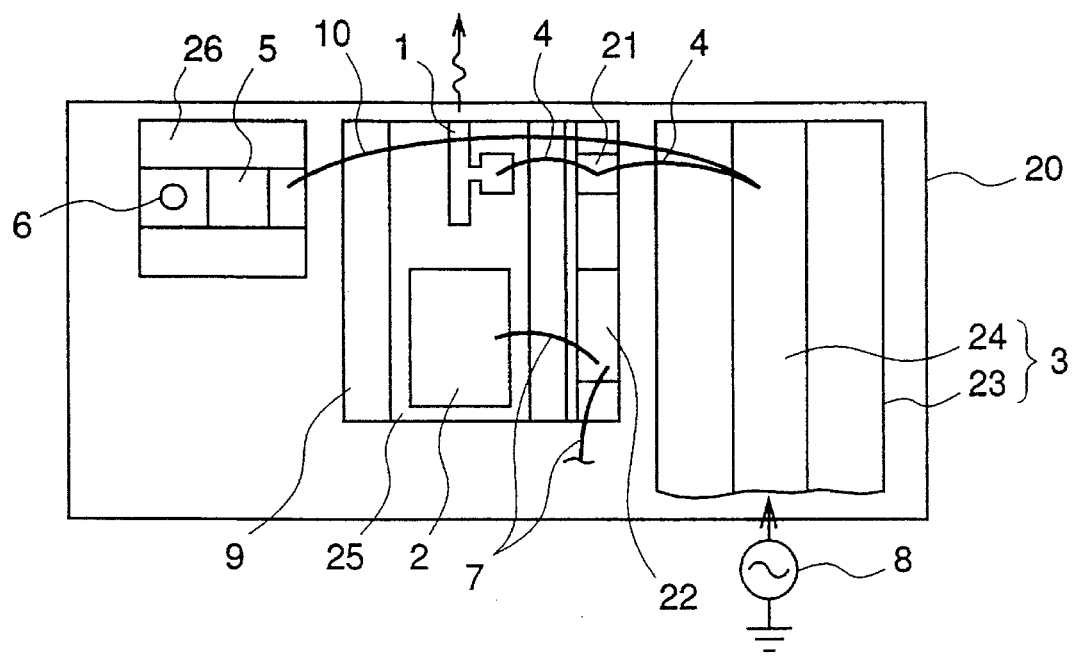
FIG. 11 is a plan view schematically illustrating a light modulator module in accordance with a sixth embodiment of the present invention.

FIG. 11 is a plan view schematically illustrating a light modulator module in accordance with a sixth embodiment of the present invention.

In the first to fifth embodiments of the invention, the terminating resistor is connected to the signal input terminal of the light modulator with the second wire or it is connected to the intermediate portion of the first wire. However, the terminating resistor 5 may be connected directly to the first terminal of the strip line 3 with the second wire 10 as shown in FIG. 11. Also in this case, the inductance of the second wire 10 is present between the signal supply 8 and the terminating resistor 5. Therefore, when the frequency is increased, the current flowing through the terminating resistor 5 decreases, and this decrease in the current compensates for an increase in the current flowing through the semiconductor light modulator 1 due to the increase in the frequency. As a result, the return loss S11 is reduced.

What is claimed is:

1. A light modulator module comprising:
   a submount;
   a semiconductor laser and a semiconductor light modulator having a signal input terminal integrated on the submount, the semiconductor laser outputting laser light and the semiconductor light modulator modulating the laser light in response to a high-frequency signal input to the signal input terminal;
   a strip line for transmitting the high-frequency signal, the strip line having opposed first and second terminals, the second terminal receiving the high-frequency signal;
   a terminating resistor terminating the strip line, the terminating resistor having opposed first and second ends, the second end being grounded;
   a first wire connecting the signal input terminal of the semiconductor light modulator to the first terminal of the strip line; and
   a second wire connecting the first end of the terminating resistor to the signal input terminal of the semiconductor light modulator.

2. The light modulator module of claim 1 wherein the terminating resistor is disposed on the submount.

3. The light modulator module of claim 2 wherein the location of the terminating resistor is changeable.

4. The light modulator module of claim 1 including a bonding pad disposed on the submount to which the second wire is connected.

5. A light modulator module comprising:
   an integrated semiconductor laser and semiconductor light modulator, the semiconductor light modulator having a signal input terminal, the semiconductor laser outputting laser light and the semiconductor light modulator modulating the laser light in response to the a high-frequency signal input to the signal input terminal;
   a strip line for transmitting the high-frequency signal, the strip line having opposed first and second terminals, the second terminal receiving the high-frequency signal;
   a terminating resistor for terminating the strip line, the terminating resistor having opposed first and second ends, the second end being grounded;
   a first wire connecting the signal input terminal of the semiconductor light modulator to the first terminal of the strip line; and
   a second wire connecting the first end of the terminating resistor to the first wire intermediate ends of the first wire.

6. The light modulator module of claim 1 wherein the terminating resistor is disposed in the proximity of the first terminal of the strip line.

7. The light modulator module of claim 5 wherein the terminating resistor is disposed in the proximity of the first terminal of the strip line.

8. The light modulator module of claim 1 wherein the second wire has an inductance L (nH) and the semiconductor light modulator has a capacitance C (pF), and the inductance L is selected according to the following formula:

$$L\ (nH) = C\ (pF) \times m\ (m=0.7\text{--}2.5\ nH/pF).$$

9. The light modulator module of claim 5 wherein the second wire has an inductance L (nH) and the semiconductor light modulator has a capacitance C (pF), and the inductance L is selected according to the following formula:

$$L\ (nH) = C\ (pF) \times m\ (m=0.7\text{--}2.5\ nH/pF).$$

10. A light modulator module comprising:
    an integrated semiconductor laser and semiconductor light modulator, the semiconductor light modulator having a signal input terminal, the semiconductor laser outputting laser light and the semiconductor light modulator modulating the laser light in response to the a high-frequency signal input to the signal input terminal;
    a strip line for transmitting the high-frequency signal, the strip line having opposed first and second terminals, the second terminal receiving the high-frequency signal;

a terminating resistor terminating the strip line, the terminating resistor having opposed first and second ends, the second end being grounded;

a first wire connecting the signal input terminal of the semiconductor light modulator to the first terminal of the strip line; and a second wire connecting the first end of the terminating resistor to the first terminal of the strip line.

11. A method of fabricating a light modulator module comprising:

mounting on a submount a semi-conductor laser and a semiconductor light modulator having a signal input terminal, the semiconductor laser outputting laser light and the semiconductor light modulator modulating the laser light in response to the a high-frequency signal input to the signal input terminal of the light modulator from a signal supply;

disposing a submount on a carrier;

disposing on the carrier a strip line for transmitting the high-frequency signal, the strip line having opposed first and second terminals, the second terminal being connected to the signal supply;

disposing on the carrier a terminating resistor for terminating the strip line, the terminating resistor having opposed first and second ends, the second end being grounded;

connecting the signal input terminal of the semiconductor light modulator to the first terminal of the strip line with a first wire; and connecting the first end of the terminating resistor to the signal input terminal of the semiconductor light modulator with a second wire.

12. The method of claim 11 including disposing the terminating resistor on a portion of the submount.

13. The method of claim 11 including adjusting the length of the second wire by changing the position where the terminating resistor is disposed.

14. The method of claim 11 including disposing a bonding pad to which the second wire is connected, on the submount.

15. A method of fabricating a light modulator module comprising:

mounting on a submount a semi-conductor laser and a semiconductor light modulator having a signal input terminal, the semiconductor laser outputting laser light and the semiconductor light modulator modulating the laser light in response to the a high-frequency signal input to the signal input terminal of the light modulator from a signal supply;

disposing a submount on a carrier;

disposing a strip line for transmitting the high-frequency signal on the carrier, the strip line having opposed first and second terminals, the second terminal being connected to the signal supply;

disposing a terminating resistor terminating the strip line on the carrier, the terminating resistor having opposed first and second ends, the second end being grounded;

connecting the signal input terminal of the semiconductor light modulator to the first terminal of the strip line with a first wire; and connecting the first end of the terminating resistor to the first wire intermediate ends of the first wire with a second wire.

16. The method of claim 11 including disposing the terminating resistor in the proximity of the first terminal of the strip line.

17. The method of claim 15 including disposing the terminating resistor in the proximity of the first terminal of the strip line.

18. The method of claim 11 wherein the second wire has an inductance L (nH) and the semiconductor light modulator has a capacitance C (pF), and the inductance L is selected according to the following formula:

$$L \ (nH) = C \ (pF) \times m \ (m=0.7\text{--}2.5 \ nH/pF).$$

19. The method of claim 15 wherein the second wire has an inductance L (nH) and the semiconductor light modulator has a capacitance C (pF), and the inductance L is selected according to the following formula:

$$L \ (nH) = C \ (pF) \times m \ (m=0.7\text{--}2.5 \ nH/pF).$$

20. A method of fabricating a light modulator module comprising:

mounting on a submount a semiconductor laser and a semiconductor light modulator having a signal input terminal, the semiconductor laser outputting laser light and the semiconductor light modulator modulating the laser light in response to the a high-frequency signal that is input to the signal input terminal of the light modulator from a signal supply;

disposing a submount on a carrier;

disposing on the carrier a strip line for transmitting the high-frequency signal, the strip line having opposed first and second terminals, the second terminal being connected to the signal supply;

disposing on the carrier a terminating resistor terminating the strip line, the terminating resistor having opposed first and second ends, the second end being grounded;

connecting the signal input terminal of the semiconductor light modulator to the first terminal of the strip line with a first wire; and connecting the first end of the terminating resistor to the first terminal of the strip line with a second wire.

* * * * *

UNITED STATES PATENT AND TRADEMARK OFFICE
CERTIFICATE OF CORRECTION

PATENT NO. : 5,602,672
DATED : February 11, 1997
INVENTOR(S) : Ishimura et al.

It is certified that error appears in the above-indentified patent and that said Letters Patent is hereby corrected as shown below:

Column 12, Line 22, delete --the-- (second occurrence);

Line 62, delete --the-- (second occurrence);

Column 13, Line 11, after "semi" delete -- - --;

Line 16, delete --the--;

Line 41, after "pad" insert --,--;

Line 44, after "semi" delete -- - --;

Line 48, delete --the--;

Column 14, Line 37, delete --the--.

Signed and Sealed this

Twentieth Day of May, 1997

Attest:

BRUCE LEHMAN

*Attesting Officer*          *Commissioner of Patents and Trademarks*